United States Patent [19]

Haskell

[11] Patent Number: 4,495,025
[45] Date of Patent: Jan. 22, 1985

[54] PROCESS FOR FORMING GROOVES HAVING DIFFERENT DEPTHS USING A SINGLE MASKING STEP

[75] Inventor: Jacob D. Haskell, Palo Alto, Calif.

[73] Assignee: Advanced Micro Devices, Inc., Sunnyvale, Calif.

[21] Appl. No.: 597,617

[22] Filed: Apr. 6, 1984

[51] Int. Cl.$^3$ .................... H01L 21/306; B44C 1/22; C03C 15/00; C03C 25/06

[52] U.S. Cl. .................. 156/648; 29/576 W; 29/580; 148/187; 156/651; 156/653; 156/657; 156/661.1; 357/49; 427/93; 430/313

[58] Field of Search .............. 156/648, 628, 651, 652, 156/653, 657, 659.1, 661.1, 662; 148/1.5, 187; 29/576 W, 580; 357/23, 47, 48, 49, 50, 56; 430/312, 313, 316, 317; 427/88, 89, 90, 93

[56] References Cited

U.S. PATENT DOCUMENTS 4,445,967  5/1984  Kameyama .................. 156/648

OTHER PUBLICATIONS

T. Yamaguchi, et al., "High-Speed Latchup Free 0.5-um-Channel CMOS Using Self Aligned TiSi$_2$ and Deep-Trench Isolation Technologies, " Proceedings IEDM 1983, pp. 522-525.

D.N.K. Wang et al., "Reactive Ion-Etching Eases Restrictions on Materials and Feature Sizes", Electronics, Nov. 3, 1983, pp. 157-161.

*Primary Examiner*—William A. Powell
*Attorney, Agent, or Firm*—J. Vincent Tortolano; Patrick T. King

[57] ABSTRACT

A process for forming grooves of different depths using a single masking step is presented. In the preferred embodiment of the present invention a photoresist material is used as a single masking layer. The grooves of different types are defined in the masking layer such that the image for a first type groove is narrower in width than the image for a second type groove. The grooves are then formed by subsequent etching steps using conventional etching and anisotropic etching techniques. The grooves are etched to different depths by calculating the proper thickness of a protective layer in relationship to the different groove widths which will allow the deeper groove to be etched without affecting the shallower groove.

19 Claims, 10 Drawing Figures

PROCESS FOR FORMING GROOVES HAVING DIFFERENT DEPTHS USING A SINGLE MASKING STEP

CROSS-REFERENCE TO RELATED APPLICATION

This invention relates to a semiconductor device as described in a copending U.S. Patent application entitled, *A Semiconductor Device Having Grooves of Different Depths for Improved Device Isolation,* filed the same day as the instant application by the same inventor, and assigned to the same assignee.

BACKGROUND OF THE INVENTION

1. Field of the Invention

This invention relates to a process for forming grooves of different types in a semiconductor material, and more particularly to a process for forming grooves of different depths using a single masking step.

2. Description of the Prior Art

The increase in densities of integrated circuits has instigated a trend in isolation technology of using trench or groove formation processes for forming physical gaps between active regions in lieu of the more conventional pn junction and local oxidation (LO-COS ™) structures. See, e.g., D. N. K. Wang, et al, "Reactive-Ion Etching Eases Restrictions on Materials and Feature Sizes", *Electronics,* Nov. 3, 1983, pp. 157,159. Groove isolation is particularly useful in CMOS applications as a method of improving latch-up susceptibility. See, e.g., T. Yamaguchi, et al, "High Speed Latch-up Free 0.5-um Channel CMOS Using Self-Aligned $TiSi_2$ and Deep-Trench Isolation Technologies", *Proceedings IEDM* 1983, p. 522. Latch-up can be defined as a state of high excess current accompanied by a low-voltage condition, such that a CMOS device can exhibit parasitic bipolar action, in essence creating a conductive low-impedance path between adjacent devices or substrate areas. Within a well of a CMOS device, a vertical parasitic bipolar device may be formed. In addition, parasitic action can occur laterally between devices within adjacent wells or substrate areas of different conductivity type.

The potential for the occurrence of latch-up increases as circuit density increases (i.e. individual devices are positioned closer together). Conventional techniques for isolating active devices suffer from a density penality which is greatly reduced by the use of grooves for device isolation.

The type of groove necessary to prevent latch-up differs from the type of groove necessary to obtain isolation, specifically with regard to the physical dimensions of the grooves. In particular, a deeper groove is necessary to prevent latch-up between devices in adjacent regions of different conductivity type (sometimes termed wells), while a shallower groove is sufficient to provide isolation between adjacent devices within the same well. Thus, it is ultimately desirable to form grooves of various types on the same integrated circuit.

Since many of the same process steps will be used for forming different types of grooves, it would be desirable to use a single masking step for forming each type of groove.

The use of a single masking step for forming different circuit features is becoming more desirable due to the increasing complexity of devices. When integrated circuits were based on simpler structures one could use separate mask sets for most of the layers in sequence. However, as structures have become progressively more complex it has become necessary to use other means in addition to separate masks to produce structural features. Separate masks and the associated processing steps reduce yield and add to the cost of processing and are therefore to be avoided, if possible.

SUMMARY OF THE INVENTION

The present invention is directed to a process for forming grooves of different depths in a wafer of semiconductor material utilizing a single masking step. In an embodiment relating to a CMOS structure, the fabrication of grooves of different depths is achieved in accordance with the present invention by etching a semiconductor wafer using a masking layer of photoresist material having images therein for the different type grooves to be formed. The process comprises the steps of: depositing a first protective layer over an epitaxial layer of the semiconductor material and then depositing a masking layer of photoresist material over the first protective layer; exposing the masking layer of photoresist material to define within the masking layer images for the different types of grooves to be formed, and developing the masking layer of photoresist material to expose regions of the first protective layer where the grooves are to be formed; etching the exposed regions of the first protective layer to expose regions of the epitaxial layer where the grooves are to be formed; etching the exposed regions of the epitaxial layer to form the different types of grooves, with one first type groove being formed in an N-well of the epitaxial layer, another first type groove being formed in a P-well of the epitaxial layer, a second type groove being formed at an intersection of the N-well and P-well regions, and such that each first type groove is narrower in width than the second type groove; stripping the masking layer of photoresist material from the first protective layer and depositing a second protective layer of a predetermined thickness over the first protective layer and over the previously formed grooves, such that the first type grooves are substantially filled in and the second type groove is partially filled in; anisotropically etching the second protective layer so as to remove it from the bottom of the second type groove exposing a region of the underlying exitaxial layer; and lastly, etching the second type groove and the exposed region of the epitaxial layer to such a depth that the second type groove penetrates the substrate of the semiconductor material.

Accordingly, it is an object of this invention to provide a process for forming grooves of different depths in a wafer of semiconductor material utilizing a single masking step.

Further objects and advantages of this invention will become apparent from the study of the following portion of the specification, the claims and the attached drawings.

BRIEF DESCRIPTION OF THE DRAWINGS

FIGS. 1a-1h, 1j and 1k are cross-sections showing a process sequence where grooves of different depths are formed in a wafer of semiconductor material utilizing a single masking step, and in which particularly;

DETAILED DESCRIPTION OF A SPECIFIC EMBODIMENT

Reference is now made in detail to a specific embodiment of the present invention, which illustrates the best mode presently contemplated by the inventor for practicing the invention, the specific embodiment of which is set forth in the accompanying drawings.

The process of the present invention for forming grooves of different depths in a semiconductor material has general application to device isolation in integrated circuits. Device isolation is particularly critical in scaling down device geometries of Complementary Metal Oxide Semiconductor (CMOS) integrated circuits. In accordance with the preferred embodiment of the present invention, FIGS. 1a–1h, 1j and 1k are cross-sections showing a process sequence where grooves of different depths are formed in a CMOS wafer utilizing a single masking step.

Figure 1A:
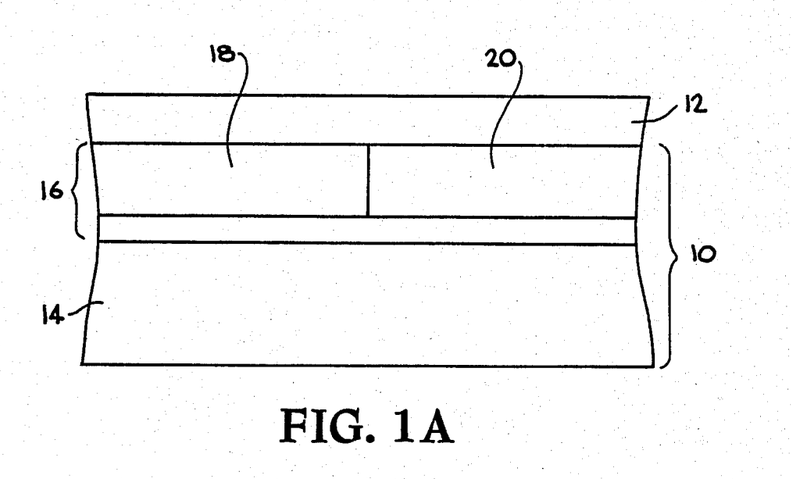
FIG. 1a is a cross-section of a layer of protective material on a wafer of semiconductor material having N-well and P-well regions in an epitaxial layer over a substrate.

FIG. 1a shows a semiconductor wafer 10 covered by a layer of silicon dioxide 12. The semiconductor wafer 10 includes a substrate 14 and an expitaxial layer 16. The epitaxial layer 16 includes an N-well region 18 and a P-well region 20. The epitaxial layer 16, comprised of silicon, can be formed by conventional deposition techniques of contacting the substrate 14 with a flow of gas (e.g., silicon tetrachloride) at an elevated temperature. The N-well region 18 and the P-well region 20 can be formed by conventional diffusion techniques for introducing a controlled amount of selected inpurities into selected regions of a semiconductor crystal. The oxide layer 12 can be formed by conventional chemical vapor deposition techniques. As described below, the oxide layer may be masked and opened up by lithographic, masking and etching techniques. The regions that are opened up will establish the areas where grooves are to be formed.

Figure 1B:
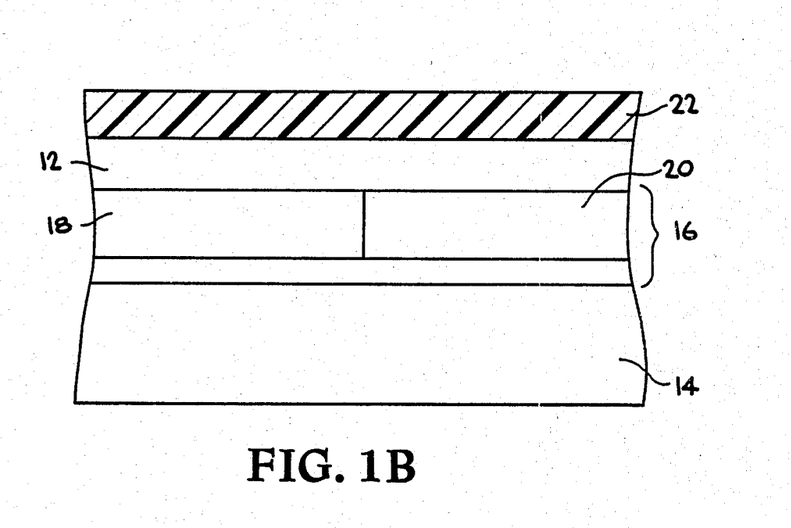
FIG. 1b is a cross-section showing FIG. 1a after a masking layer of photoresist material has been applied.
Figure 1C:
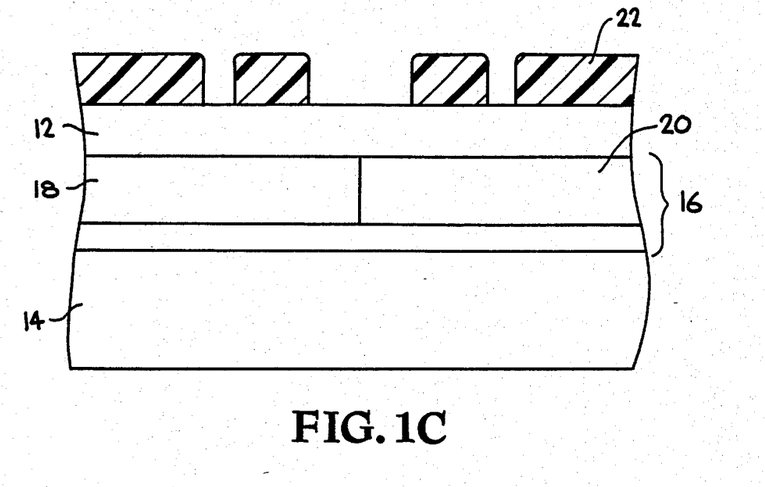
FIG. 1c is a cross-section showing FIG. 1b after the layer of photoresist material has been optically exposed and then developed to expose the portions of the layer of protective material where grooves are to be formed.

FIG. 1b shows the cross-section of FIG. 1a after a masking photoresist layer 22 has been applied over the oxide layer 12. The masking photoresist layer 22 can be applied in a conventional manner such as spinning or spraying onto a semiconductor wafer a chemical formulation containing a light sensitive material. The masking photoresist layer 22 is then optically exposed by conventional techniques to define within the mask images for two first type grooves and a second type groove, where each first type groove image is narrower in width than the second type groove image. Then, as shown in FIG. 1c, the masking photoresist layer 22 is developed by placing it in contact with a developing agent, thereby opening up the masking photoresist layer 22 to allow the etching of the oxide layer 12.

Figure 1D:
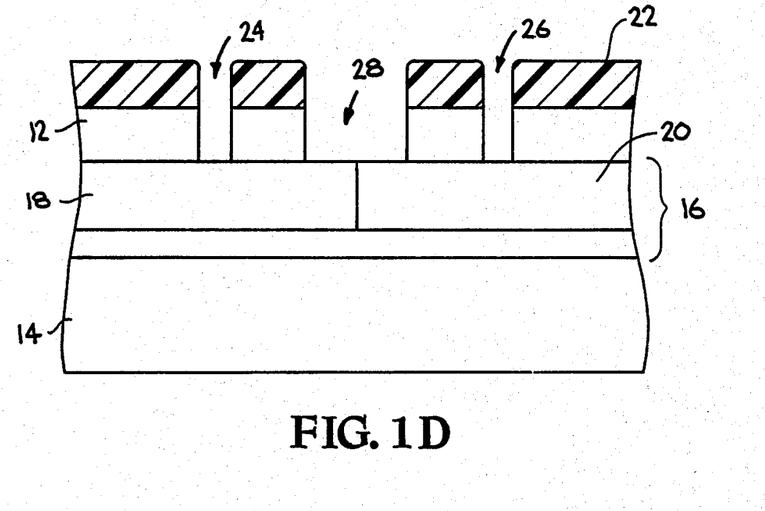
FIG. 1d is a cross-section showing FIG. 1c after the layer of protective material has been etched to expose the portions of the epitaxial layer where grooves are to be formed.
Figure 1E:
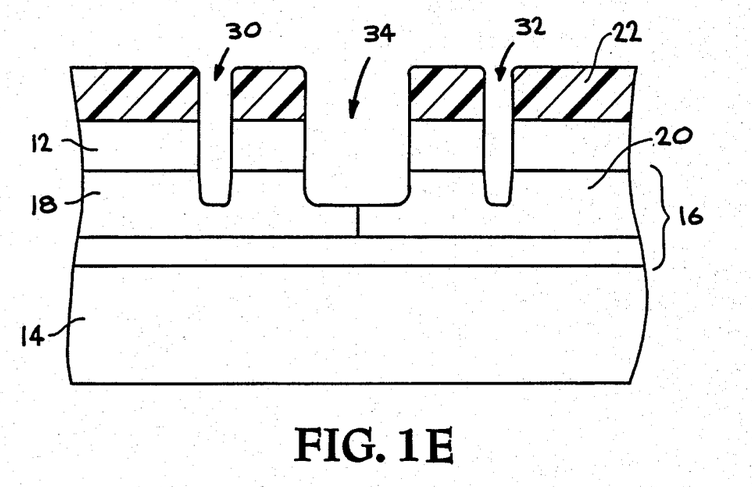
FIG. 1e is a cross-section showing FIG. 1d after first and second type grooves have been etched into the epitaxial layer.

Next, using a conventional oxide etchant, the oxide layer 12 is etched down to the epitaxial layer 16, as shown in FIG. 1d, to define first type groove regions 24 and 26 and a second type groove region 28. Then, as shown in FIG. 1e, the exposed regions 24, 26 and 28 of the epitaxial layer 16 are etched using a conventional oxide etching technique to form the first type grooves 30 and 32 and the second type groove 34. The first type grooves 30 and 32 are narrower in width than the second type groove 34 in accordance with the images previously transmitted into the masking photoresist layer 22. The depth of the grooves is controlled by the length of the etch. In accordance with the preferred embodiment of the present invention, the first type grooves 30 and 32 will function to isolate devices within the N-well and P-well regions 18 and 20, respectively. Therefore, the depth of the grooves 30 and 32 must be less than the depth of the N-well and P-well regions 18 and 20 so that adjacent devices within a well can be isolated.

According to the preferred embodiment of the present invention, the second type groove will function to isolate the N-well and P-well regions 18 and 20 from each other. Therefore, the second type groove 34 must be formed at the intersection of N-well and P-well regions 18 and 20, and the depth of the second type groove 34 must be greater than the depth of the N-well and P-well regions 18 and 20, i.e., the second type groove 34 must penetrate the substrate 14. The process of the present invention can also be applied to provide isolation between a well region of one conductivity type and a substrate area of a different conductivity type.

After the grooves 30, 32 and 34 have been etched in the epitaxial layer 16, the masking photoresist layer 22 is stripped from the oxide layer 12. Removal of the masking photoresist layer 22 may be accomplished by conventional techniques which employ solvents, acid baths or reactive oxidation for photoresist removal. After removal of the masking photoresist layer 22, a second protective layer of a predetermined thickness will be deposited over the exposed surfaces of the oxide layer 12 and the epitaxial layer 16.

Figure 1F:
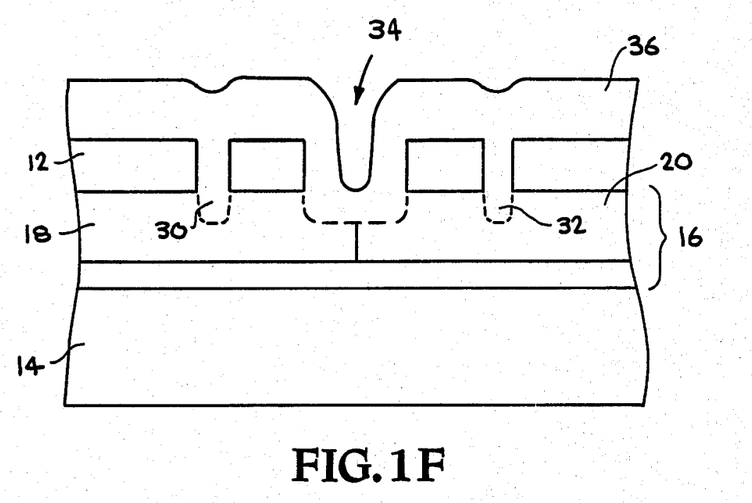
FIG. 1f is a cross-section showing FIG. 1e after the masking layer of photoresist material has been stripped and a second layer of protective material has been applied over the first layer of protective material and over the previously formed grooves.

In accordance with the preferred embodiment of the present invention, and as illustrated in FIG. 1f, a second protective layer of silicon dioxide 36 is universally deposited over the exposed surface of the integrated circuit in process. The second oxide layer 36 can be formed to a predetermined thickness by conventional chemical vapor deposition techniques. The second oxide layer 36 will substantially fill the narrower first type grooves 30 and 32 but will only partially fill the wider second type groove 34, as a result of the different groove widths.

Figure 1G:
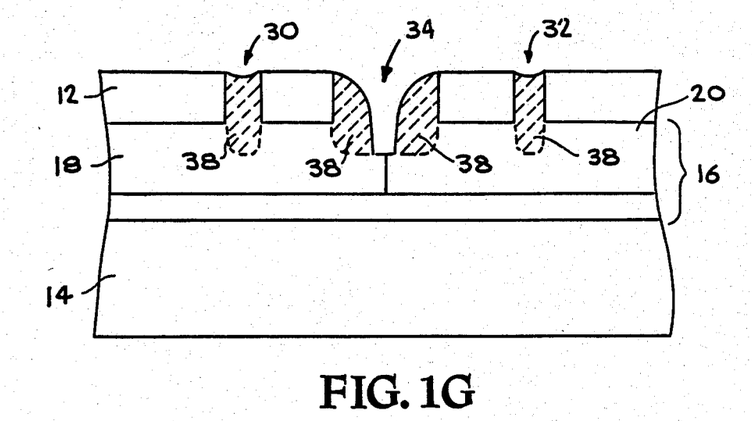
FIG. 1g is a cross-section showing FIG. 1f after the second layer of protective material has been anisotropically etched to clear the bottom area of the second type groove, exposing the underlying surface of the epitaxial layer.

After application, the second oxide layer 36 is etched down to the surface of the first oxide layer 12 by an anisotropic etching step which removes the second oxide layer 36 from the bottom of the second type groove 34, thereby exposing a region of the underlying epitaxial layer 16.

In accordance with the preferred embodiment of the present invention as described below, the end point of the anisotropic etching process is determined by the thickness of the second oxide layer 36. The precise thickness of the second oxide layer 36 is calculated such that anisotropically etching down to the surface of the first oxide layer 12 will remove the second oxide layer 36 from the bottom of the second type groove 34, thereby exposing a region of the underlying epitaxial layer 16. For example, if the first type grooves 30 and 32 are each 1.5 microns in width and 1 micron deep, and the second type groove 34 is 4 microns in width and 1 micron deep, a second oxide layer 36 of approximately 1.5-2.0 microns in thickness will fill the first type grooves 30 and 32, and will partially fill the second type groove 34 with an appropriate amount of material to achieve the desired results on the subsequent etching of the second oxide layer 36. After the second oxide layer 36 has been etched, the first type grooves 30 and 32 remain substantially filled with oxide material 38, which improves the isolating characteristics of the first type grooves 30 and 32. Also, prior to the application of the second oxide layer 36, the first type grooves 30 and 32 can be implanted with a material of a conductivity type different from the conductivity type of the region in which the groove is formed (e.g., implanting a P-type material in the first type groove 30 in the N-well region 18). Implanting in this manner will provide better isolation.

Figure 1H:
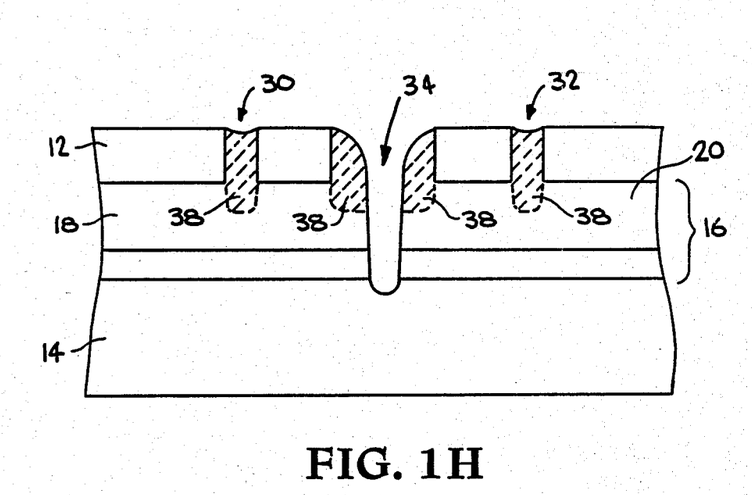
FIG. 1h is a cross-section showing FIG. 1g after the second type groove and the underlying epitaxial layer have been etched to penetrate the substrate of the semiconductor wafer.

Following the etch to remove the second oxide layer 36 from the bottom of the second type groove 34, a conventional selective etchant is used to etch the second type groove 34 and the exposed region of the underlying epitaxial layer 16 to a depth sufficient to penetrate substrate 14, as shown in FIG. 1h. An etchant is used which selectively etches the epitaxial layer 16 and the substrate 14 preferentially over the oxide layer 12 and the oxide material 38 in first type grooves 30 and 32. By using an appropriate etchant of the type known in the art to have selective etching properties, the second type groove 34 can be etched to a depth sufficient to penetrate the substrate 14, while leaving the oxide layer 12 and the oxide material 38 in first type grooves 30 and 32 substantially unchanged. By intersecting the substrate 14, the second type groove 34 effectively isolates the N-well and P-well regions 18 and 20 from each other. The doping of the substrate 14 is typically in excess of $10^{18}$ impurities/cm$^3$. The heavy doping insures that there is sufficient recombination of minority carriers to make the second type groove 34 effective.

Figure 1J:
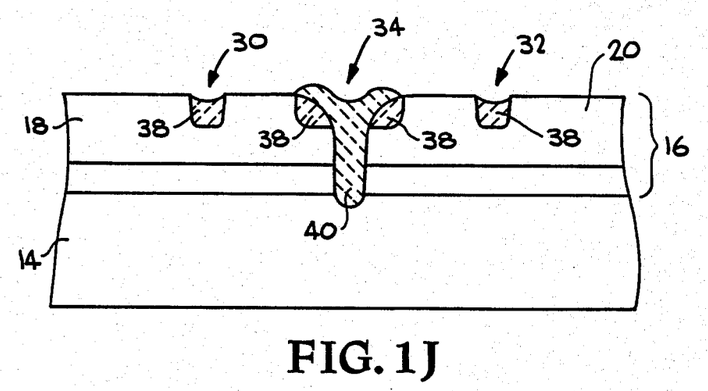
FIG. 1j is a cross-section showing FIG. 1h after the second type groove has been filled with a filler material.
Figure 1K:
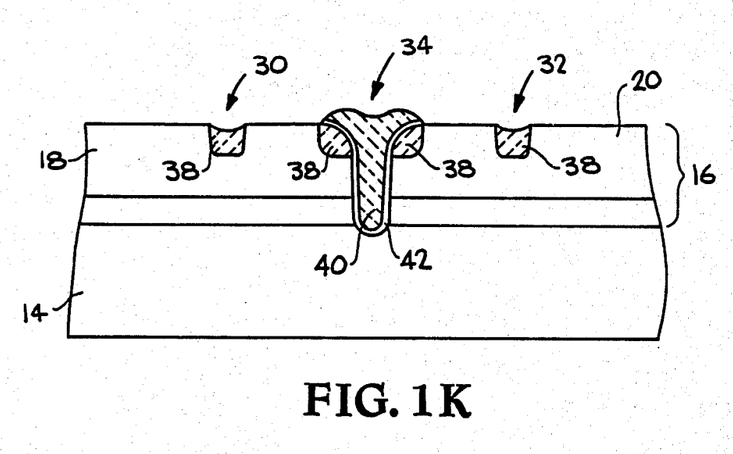
FIG. 1k is a cross-section showing FIG. 1j with an oxide layer formed on the inside surface of the second type groove.

After the second type groove 34 has been etched to penetrate the substrate 14, it can be filled with a filler material 40 as shown in FIG. 1j. The filler material 40 can be a non-conducting type of material chosen from appropriate materials known in the art such as oxide. If oxide is to be used as filler material, it is first universally deposited over the surface of the integrated circuit in process by conventional techniques such as low pressure chemical vapor deposition (not shown). An anisotropic etching step is then performed to etch the previously deposited oxide layer and the oxide layer 12 back to the silicon surface of the epitaxial layer 16. Alternatively, an etching step may be done first to etch the oxide layer 12 back to the surface of epitaxial layer 16. Then, a layer of oxide can be deposited over the exposed surface of the epitaxial layer 16 thereby filling the second type groove 34, followed by an etching of the deposited oxide back to the surface of the epitaxial layer 16. Other methods of etching and filling the second type groove 34 are possible using conventional techniques known to those in the art. For example, polysilicon could be used to backfill the grooves 30, 32 and 34 instead of applying the second oxide layer 36. Before depositing the polysilicon, a short thermal oxidation may be done to form an oxide layer 42 on the inside surface of second type groove 34, as shown in FIG. 1k, to isolate the polysilicon filler material 40 from the epitaxial layer 16. This method would reduce thermal stress and would allow the first oxide layer 12 to be used as a stop layer for the subsequent etch to clear the bottom of the second type groove 34. Using polysilicon to backfill the grooves 30, 32 and 34 would provide a strong end point detection method for the subsequent filling of the second type groove 34 after it is etched to penetrate the substrate 14. Additional methods of filling the second type groove 34 are also possible using combinations of polysilicon and oxide to alleviate thermal stress and enhance planarity.

The foregoing description of a specific embodiment of the present invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto and their equivalents.

What is claimed is:

1. A process for forming grooves of different depths in a wafer of semiconductor material utilizing a single masking step, said process comprising the steps of:
    depositing a first protective layer over the surface of a substrate of said semiconductor material;
    depositing a masking layer of photoresist material over the surface of said first protective layer;
    optically exposing said masking layer of photoresist material to define within said masking layer of photoresist material images for a first type groove and a second type groove, where said first type groove image is narrower in width than said second type groove image;
    developing said masking layer of photoresist material to expose regions of said first protective layer where grooves of said first type and said second type are to be formed;
    etching said exposed regions of said first protective layer to expose regions of said substrate where grooves of said first type and said second type are to be formed;
    etching said exposed regions of said substrate to form grooves of said first type and said second type, such that said first type groove is narrower in width than said second type groove;

stripping said masking layer of photoresist material from said first protective layer;

depositing a second protective layer of a predetermined thickness over said first protective layer and over said first type groove and said second type groove such that said first type groove is substantially filled in and said second type groove is partially filled in;

anisotropically etching the second protective layer so as to remove said second protective layer from the bottom of said second type groove exposing a region of said substrate thereunder; and etching said second type groove so as to penetrate to a desired depth the exposed region of said substrate thereunder.

2. A process for forming grooves of different depths in accordance with claim 1, wherein the following step is performed:

filling said second type groove with a filler material.

3. A process for forming grooves of different depths in accordance with claim 1, wherein the following step is performed:

doping the substrate.

4. A process for forming grooves of different depths in accordance with claim 1 wherein the step of etching said second type groove so as to penetrate to a desired depth the region of said substrate thereunder is accomplished by the step of etching said second type groove by an etch which selectively etches said substrate preferentially over said first protective layer.

5. A process for forming grooves of different depths in accordance with claim 1 wherein the step of depositing said first protective layer over the surface of said substrate of said semiconductor material is accomplished by the step of applying a layer of protective material by low pressure chemical vapor deposition.

6. A process for forming grooves of different depths in accordance with claim 1 wherein the step of depositing said second protective layer of a predetermined thickness over said first protective layer and over said first type groove and said second type groove is accomplished by the step of applying a layer of protective material by low pressure chemical vapor deposition.

7. A process for forming grooves of different depths in accordance with claim 5 or 6 wherein the step of applying said layer of protective material by low pressure chemical vapor deposition is accomplished by the step of applying a layer of silicon dioxide by low pressure chemical vapor deposition.

8. A process for forming grooves of different depths in accordance with claim 6 wherein the step of applying said layer of protective material by low pressure chemical vapor deposition is accomplished by the step of applying a layer of polysilicon by low pressure chemical vapor deposition.

9. A process for forming grooves of different depths in accordance with claim 8 further including the step of forming a layer of thermal oxide on the inside surface of said second type groove.

10. A process for forming grooves of different depths in a wafer of semiconductor material utilizing a single masking step, said wafer of semiconductor material having a substrate and an epitaxial layer over said substrate, said process comprising the steps of:

depositing a first protective layer over said epitaxial layer;

depositing a masking layer of photoresist material over the surface of said first protective layer;

optically exposing said masking layer of photoresist material to define within said masking layer of photoresist material images for at least two first type grooves and a second type groove, where said first type groove images are each narrower in width than said second type groove image;

developing said masking layer of photoresist material to expose regions of said first protective layer where grooves of said first type and said second type are to be formed;

etching said exposed regions of said first protective layer to expose regions of said epitaxial layer where grooves of said first type and said second type are to be formed;

etching said exposed regions of said epitaxial layer to form grooves of said first type and said second type, such that one said first type groove is formed in an N-region of said epitaxial layer, another said first type groove is formed in a P-region of said epitaxial layer, said second type groove is formed at an intersection of said N-region and said P-region, and such that said first type grooves are each narrower in width than said second type groove;

stripping said masking layer of photoresist material from said first protective layer;

depositing a second protective layer of a predetermined thickness over said first protective layer and over said first type grooves and said second type groove such that said first type grooves are substantially filled in and said second type groove is partially filled in;

anisotropically etching the second protective layer so as to remove said second protective layer from the bottom of said second type groove exposing thereunder a region of said epitaxial layer; and etching said second type groove and the exposed region of said epitaxial layer thereunder to such a depth that said second type groove penetrates said substrate.

11. A process for forming grooves of different depths in accordance with claim 10, wherein the following step is performed:

filling said second type groove with a filler material.

12. A process for forming grooves of different depths in accordance with claim 10, wherein the following step is performed:

doping the substrate.

13. A process for forming grooves of different depths in accordance with claim 10, wherein the step of etching said second type groove and the region of said epitaxial layer thereunder to such a depth that said second type groove penetrates said substrate is accomplished by the step of etching said second type groove and the region of said epitaxial layer thereunder by an etch which selectively etches said epitaxial layer and said substrate preferentially over said first protective layer.

14. A process for forming grooves of different depths in accordance with claim 10 wherein the following steps are performed:

implanting an N-type material in the first type groove in the P-region of said epitaxial layer; and implanting a P-type material in the first type groove in the N-region of said epitaxial layer.

15. A process for forming grooves of different depths in accordance with claim 10 wherein the step of depositing said first protective layer over said epitaxial layer is accomplished by the step of applying a layer of protective material by low pressure chemical vapor deposition.

16. A process for forming grooves of different depths in accordance with claim 10 wherein the step of depositing said second protective layer of a predetermined thickness over said first protective layer and over said first type grooves and said second type groove is accomplished by the step of applying a layer of protective material by low pressure chemical vapor deposition.

17. A process for forming grooves of different depths in accordance with claim 15 or 16 wherein the step of applying said layer of protective material by low pressure chemical vapor deposition is accomplished by the step of applying a layer of silicon dioxide by low pressure chemical vapor deposition.

18. A process for forming grooves of different depths in accordance with claim 16 wherein the step of applying said layer of protective material by low pressure chemical vapor deposition is accomplished by the step of applying a layer of polysilicon by low pressure chemical vapor deposition.

19. A process for forming grooves of different depths in accordance with claim 16 further including the step of forming a layer of thermal oxide on the inside surface of said second type groove.

* * * * *